United States Patent
Suzuki et al.

(10) Patent No.: US 10,453,878 B2
(45) Date of Patent: Oct. 22, 2019

(54) PHOTOELECTRIC CONVERSION APPARATUS AND IMAGE-READING APPARATUS

(71) Applicant: CANON KABUSHIKI KAISHA, Tokyo (JP)

(72) Inventors: Tatsuya Suzuki, Kawasaki (JP); Masanori Ogura, Tokyo (JP); Takanori Suzuki, Tokyo (JP); Jun Iba, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 198 days.

(21) Appl. No.: 15/596,647

(22) Filed: May 16, 2017

(65) Prior Publication Data

US 2017/0345856 A1 Nov. 30, 2017

(30) Foreign Application Priority Data

May 24, 2016 (JP) .................. 2016-103715

(51) Int. Cl.
| | |
|---|---|
| *H01L 27/146* | (2006.01) |
| *H04N 5/361* | (2011.01) |
| *H04N 5/359* | (2011.01) |
| *H04N 5/374* | (2011.01) |
| *H04N 5/378* | (2011.01) |

(52) U.S. Cl.
CPC .... *H01L 27/14605* (2013.01); *H01L 27/1463* (2013.01); *H01L 27/14636* (2013.01); *H01L 27/14643* (2013.01); *H04N 5/359* (2013.01); *H04N 5/361* (2013.01); *H04N 5/374* (2013.01); *H04N 5/378* (2013.01)

(58) Field of Classification Search
CPC ......... H01L 27/14643; H01L 27/14636; H01L 27/14605; H04N 5/374
See application file for complete search history.

(56) References Cited

U.S. PATENT DOCUMENTS 6,590,242 B1 * 7/2003 Kozuka ............ H01L 27/14603 257/292
7,768,087 B2 * 8/2010 Katayama ......... H01L 27/14609 257/291

FOREIGN PATENT DOCUMENTS

| JP | 2004-312039 A | 11/2004 |
| JP | 2011-124522 A | 6/2011 |

* cited by examiner

*Primary Examiner* — Ahmed A Berhan
(74) *Attorney, Agent, or Firm* — Canon U.S.A., Inc. IP Division (57) ABSTRACT

A photoelectric conversion apparatus includes a semiconductor substrate including recessed portions and insulators disposed on the respective recessed portions. The semiconductor substrate includes a first-conductivity-type first semiconductor region, a second-conductivity-type second semiconductor region that is of a conductivity type different from the first-conductivity-type and that is formed in the first semiconductor region, a second-conductivity-type third semiconductor region in contact with the second semiconductor region on a surface of the semiconductor substrate, and a first-conductivity-type fourth semiconductor region that includes the recessed portions. The second semiconductor region and the third semiconductor region are surrounded by the fourth semiconductor region on the surface of the semiconductor substrate. The insulators on the recessed portions extend through the fourth semiconductor region and are in contact with the first semiconductor region.

32 Claims, 7 Drawing Sheets

PHOTOELECTRIC CONVERSION APPARATUS AND IMAGE-READING APPARATUS

BACKGROUND OF THE INVENTION

Field of the Invention

One disclosed aspect of the embodiments relates to a photoelectric conversion apparatus and an image-reading apparatus.

Description of the Related Art

A known photoelectric conversion apparatus uses a photodiode formed of a PN junction of a first-conductivity-type semiconductor region and a second-conductivity-type region as a photoelectric conversion element. As illustrated in FIG. 1 in Japanese Patent Laid-Open No. 2004-312039, a structure to increase a charge collection efficiency by widely forming a charge collection region having the same polarity as charges to be collected is proposed to increase the charge collection efficiency of the photoelectric conversion element in the photoelectric conversion apparatus. In Japanese Patent Laid-Open No. 2011-124522, a structure in which a LOCOS (LOCal Oxidization of Silicon) region is formed on a light-receiving surface of a photoelectric conversion element is proposed to reduce ripples with respect to the wavelength of incident light.

SUMMARY OF THE INVENTION

A photoelectric conversion apparatus according to an aspect of the embodiments includes a semiconductor substrate including recessed portions formed on a main surface thereof and insulators disposed on the respective recessed portions. The semiconductor substrate includes a photoelectric conversion element having a first-conductivity-type first semiconductor region, a second-conductivity-type second semiconductor region that is of a conductivity type opposite to the first-conductivity-type and that has the same polarity as a signal charge, and a second-conductivity-type third semiconductor region that has an impurity concentration higher than the impurity concentration of the second semiconductor region where at least a part of the second-conductivity-type third semiconductor region is formed closer than a part of the second semiconductor region to the main surface. A first recessed portion and a second recessed portion of the recessed portions are arranged so as to be adjacent to each other in a first section perpendicular to the main surface, with the third semiconductor region interposed therebetween. The second semiconductor region includes a region interposed between the first recessed portion and the second recessed portion in the first section and is in contact with the first semiconductor region. A PN junction formed of the first semiconductor region and the second semiconductor region is interposed between the first recessed portion and the second recessed portion in the first section.

A photoelectric conversion apparatus according to another aspect of the embodiments includes a semiconductor substrate including recessed portions formed on a main surface thereof and insulators disposed on the respective recessed portions. The semiconductor substrate includes a photoelectric conversion element having a first-conductivity-type first semiconductor region, a second-conductivity-type second semiconductor region that is of a conductivity type opposite to the first-conductivity-type and that has the same polarity as a signal charge, and a second-conductivity-type third semiconductor region that has an impurity concentration higher than the impurity concentration of the second semiconductor region where at least a part of the second-conductivity-type third semiconductor region is formed closer than the second semiconductor region to the main surface. A first-conductivity-type fourth semiconductor region that has an impurity concentration higher than the impurity concentration of the first semiconductor region is formed in a region of the semiconductor substrate at an interface between each of the insulators and the semiconductor substrate. The recessed portions are formed on the fourth semiconductor region. The fourth semiconductor region overlaps at least one of the first semiconductor region and the second semiconductor region with respect to a plan view of the main surface.

Further features of the disclosure will become apparent from the following description of exemplary embodiments with reference to the attached drawings.

DESCRIPTION OF THE EMBODIMENTS

An example of part of a photoelectric conversion apparatus according to an embodiment will hereinafter be described with reference to the drawings. In the following description, the embodiment uses electrons as signal charges. In the case where holes are used as the signal charges, a P-type semiconductor region is replaced with an N-type semiconductor region, and an N-type semiconductor region is replaced with a P-type semiconductor region.

Assuming that a LOCOS region to reduce ripples is formed in a photoelectric conversion apparatus in which the charge collection region having the same polarity as charges to be collected is widely formed. In this case, the LOCOS region and the charge collection region are in contact with each other, and a dark current is thereby increased.

Figure 1A:
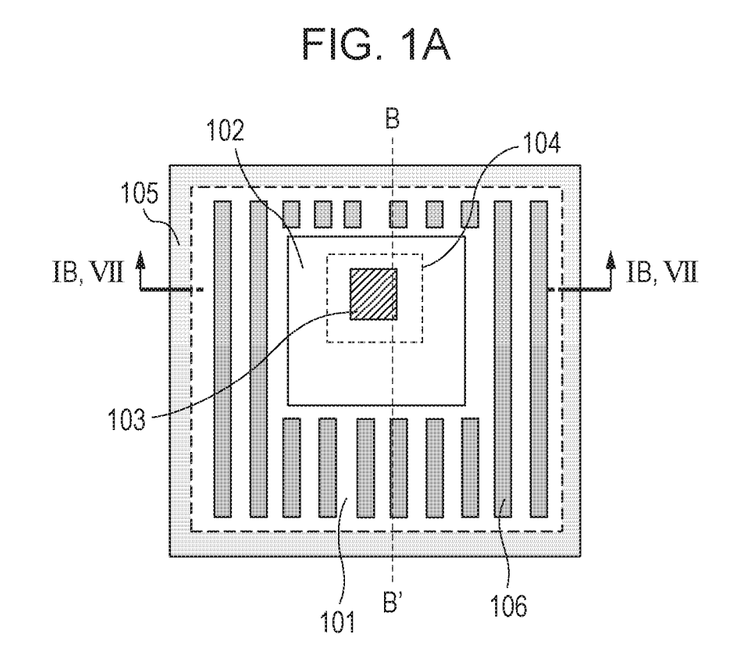
FIG. 1A is a plan view of an example of a photoelectric conversion apparatus according to a first embodiment.
Figure 1B:
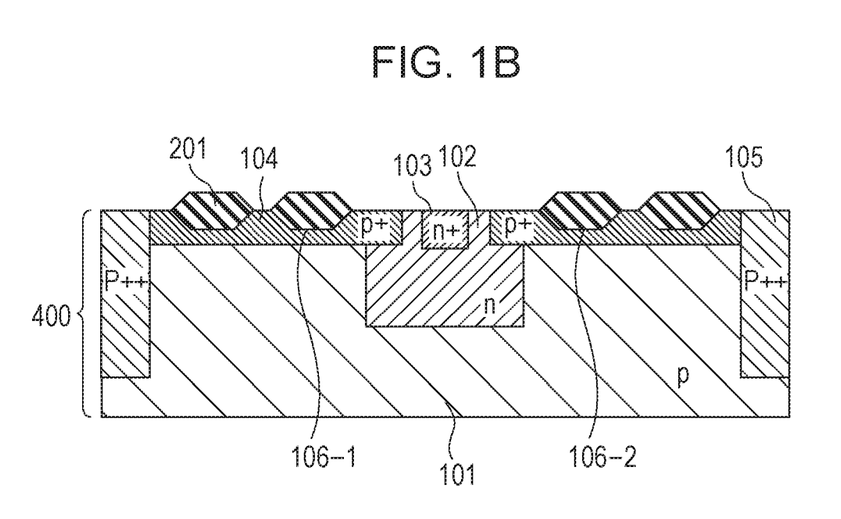
FIG. 1B is a sectional view of the example of the photoelectric conversion apparatus according to the first embodiment.

FIG. 1A is a plan view of an example of part of the photoelectric conversion apparatus according to the embodiment. FIG. 1B is a sectional view of FIG. 1A taken along line IB-IB. A photoelectric conversion apparatus 100 includes photoelectric conversion elements D1 isolated by respective element isolation portions 105.

Light enters from a main surface side of a semiconductor substrate 400 on which recessed portions 106 are formed, passes through a protective film and an interlayer insulating layer, not illustrated, formed on a main surface of the semiconductor substrate, and is incident on the semiconductor substrate 400.

In some cases, multiple reflections at the interface between the main surface of the semiconductor substrate and the interlayer insulating layer, not illustrated, formed thereon cause an output to ripple with respect to a wavelength, which exhibits spectral characteristics. If the main surface of the semiconductor substrate 400 has high flatness, the output ripples.

In contrast, the photoelectric conversion apparatus 100 illustrated in FIG. 1A includes the semiconductor substrate 400 including the recessed portions 106 on the main surface and insulators 201 disposed on the respective recessed portions 106. With this structure, the optical path length of light to be reflected from the main surface of the semiconductor substrate 400 varies due to the recessed portions 106 depending on the position at which the light is incident, resulting in a phase difference of the reflected light. The reflected light and the incident light that have different phases interfere with each other, and the ripples as the output characteristics of the photoelectric conversion apparatus 100 can thereby be reduced. For example, the recessed portions 106 can be formed in a manner in which LOCOS regions are formed on the main surface of the semiconductor substrate 400.

The semiconductor substrate 400 includes the photoelectric conversion element D1 including a first-conductivity-type (P-type) first semiconductor region 101, a second semiconductor region 102 having a conductivity type (N-type) opposite to the first-conductivity-type, and a second-conductivity-type third semiconductor region 103. The conductivity type of the second semiconductor region 102 and the third semiconductor region 103 has the same polarity as the signal charges of the photoelectric conversion element. The impurity concentration of the third semiconductor region is higher than the impurity concentration of the second semiconductor region 102. In the description, the impurity concentration means a net impurity concentration compensated by impurities having the opposite conductivity type, which is called a NET concentration.

The first-conductivity-type first semiconductor region 101 and the second-conductivity-type second semiconductor region 102 form a PN junction. The second semiconductor region 102 is formed so as to be in contact with the second-conductivity-type third semiconductor region 103 having an impurity concentration higher than the impurity concentration of the second semiconductor region 102 and has an impurity concentration distribution that causes the signal charges to gather at the third semiconductor region 103. This enables the signal charges to be collected at the third semiconductor region 103 via the second semiconductor region 102 by using a drift phenomenon. The third semiconductor region 103 is connected to a conductor, not illustrated, which is connected to a signal-reading circuit. Signals based on the signal charges collected at the third semiconductor region 103 pass through the conductor and are read by the signal-reading circuit.

In the case where the recessed portions are formed on the second semiconductor region 102, the signal charges are captured at portions at which the insulators disposed on the recessed portions and the second semiconductor region 102 are in contact with each other. Accordingly, movement of each signal charge is impeded, and the efficiency of collecting the signal charges reduces. In view of this, in the photoelectric conversion apparatus, the insulators disposed on the recessed portions 106 and the second semiconductor region 102 are not in contact with each other. A specific example of this structure will now be described.

The second semiconductor region 102 is formed so as not to overlap regions in which the recessed portions 106 are formed with respect to a plan view of the main surface of the semiconductor substrate 400, on which the recessed portions 106 are formed. For example, a first recessed portion 106-1 and a second recessed portion 106-2 of the recessed portions 106 are formed so as to be adjacent to each other in a first section (FIG. 1B) of the main surface of the semiconductor substrate 400, with the third semiconductor region 103 interposed therebetween. The second semiconductor region 102 is interposed between the first recessed portion 106-1 and the second recessed portion 106-2 in the first section.

The PN junction formed of the first semiconductor region 101 and the second semiconductor region 102 is interposed between the first recessed portion 106-1 and the second recessed portion 106-2 in the first section.

In the case where the recessed portions 106 are thus not formed on the second semiconductor region 102 but are formed on a region surrounding the second semiconductor region 102, a dark current due to contact between the insulators on the recessed portions 106 and the second semiconductor region 102 can be prevented from occurring.

In the above structure, as illustrated in FIG. 1A and FIG. 1B, a first-conductivity-type fourth semiconductor region 104 having an impurity concentration higher than the impurity concentration of the first semiconductor region 101 may be formed on a main surface side of the semiconductor substrate 400 so as to face the first semiconductor region 101. The formation of the fourth semiconductor region 104 enables the occurrence of a dark current on the semiconductor region side at the interfaces between the semiconductor substrate 400 and the insulators to be suppressed. In this case, the second semiconductor region 102 and the third semiconductor region 103 are surrounded by the fourth semiconductor region 104 with respect to a plan view of the main surface of the semiconductor substrate 400.

Figure 7:
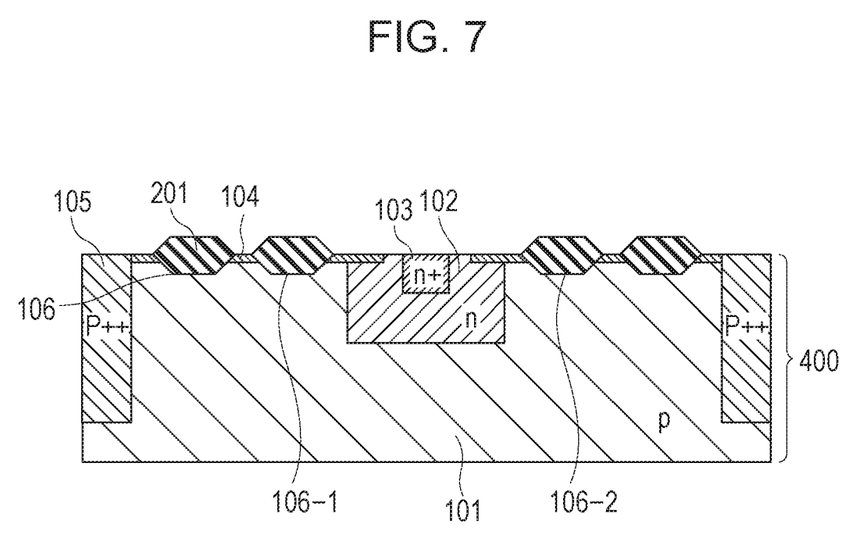
FIG. 7 is a sectional view of an example of a photoelectric conversion apparatus according to a second embodiment.

As illustrated in FIG. 1A, the recessed portions 106 may be formed on only the fourth semiconductor region 104 with respect to a plan view of the main surface. As illustrated in FIG. 1B, the fourth semiconductor region may be formed so as to extend to a location deeper than the location of the bottom portion of each recessed portion 106. As illustrated in FIG. 7, the fourth semiconductor region 104 may be formed so as to extend to a location shallower than the location of the bottom portion of each insulator 201 disposed on the corresponding recessed portion. Details of the structure will be described later.

A third recessed portion and a fourth recessed portion of the recessed portions 106 are formed so as to be adjacent to each other in a second section (for example, a cross-sectional surface of a section B-B' in FIG. 1A, shown in FIG. 1B) intersecting the first section, with the third semiconductor region interposed therebetween, as in the case of the first section. The second semiconductor region is interposed between the third recessed portion and the fourth recessed portion. The PN junction formed of the first semiconductor region 101 and the second semiconductor region 102 is interposed between the third recessed portion and the fourth recessed portion in the second section.

In the case where the fourth semiconductor region 104 is formed in a region of the semiconductor substrate 400 at the interfaces between the insulators 201 disposed on the recessed portions 106 and the semiconductor substrate 400, the photoelectric conversion apparatus may have the following structure. For example, the second semiconductor region 102 may extend so as to be in contact with the third semiconductor region 103 and so as to overlap the recessed portions 106 with respect to a plan view of the main surface. With this structure, the fourth semiconductor region 104 is in contact with the insulators 201 disposed on the recessed portions 106, and accordingly, the second semiconductor region 102 and the insulators 201 are not in contact with each other.

Accordingly, in the case where the fourth semiconductor region 104 is provided, the second semiconductor region 102 may extend so as to be in contact with the third semiconductor region 103 and so as to overlap the recessed portions 106 with respect to a plan view of the main surface of the semiconductor substrate 400. The second semiconductor region 102 may reach the element isolation portion 105.

The fourth semiconductor region 104 is formed so as to overlap at least one of the first semiconductor region 101 and the second semiconductor region 102 with respect to a plan view of the main surface of the semiconductor substrate 400, on which the recessed portions are formed.

Specific examples of the structure of the photoelectric conversion apparatus will be described according to the following embodiments.

First Embodiment

FIG. 1A is a schematic plan view of an example of part of a photoelectric conversion apparatus 100 according to a first embodiment. FIG. 1B is a schematic view of the photoelectric conversion apparatus 100 taken along line IB-IB in FIG. 1A. In FIG. 1A and FIG. 1B, like components are designated by like symbols.

The photoelectric conversion apparatus 100 includes the semiconductor substrate 400 and the insulators 201. The semiconductor substrate 400 includes the first semiconductor region 101, the second semiconductor region 102, the third semiconductor region 103, and the fourth semiconductor region 104. The insulators 201 are disposed on the recessed portions 106 formed on the main surface of the semiconductor substrate 400.

The first semiconductor region 101 may be an N-type or a P-type. According to the first embodiment, an example of a P-type semiconductor region is described. For example, the semiconductor substrate may be used as a material substrate for the first semiconductor region 101. An example described herein uses a silicon substrate.

The second semiconductor region 102 is formed inside the first semiconductor region 101 and is an N-type semiconductor region. The second semiconductor region 102 and the first semiconductor region 101 form the PN junction.

The third semiconductor region 103 is an N-type semiconductor region having an impurity concentration higher than the impurity concentration of the second semiconductor region. At least a part of the third semiconductor region 103 is formed closer than the second semiconductor region 102 to the main surface of the semiconductor substrate 400. The third semiconductor region 103 is interposed between the first recessed portion 106-1 and the second recessed portion 106-2 in the first section (FIG. 1B) perpendicular (which includes substantially perpendicular) to the main surface of the semiconductor substrate 400. Part of the second semiconductor region 102 is interposed between the first semiconductor region 101 and the third semiconductor region 103 in the depth direction (direction perpendicular (which includes substantially perpendicular) to the main surface, on which the recessed portions 106 are formed) of the semiconductor substrate 400 in the first section.

The third semiconductor region 103 collects electrons, which are signal charges. Many signal charges become carriers. The third semiconductor region 103 is electrically connected to a reading circuit. Specifically, a conductor is disposed through an opening formed in the insulating layer on the semiconductor substrate 400, and the third semiconductor region 103 is connected to the reading circuit with the conductor interposed therebetween. For example, a silicon oxide and silicon nitride may be used for the insulating layer on the semiconductor substrate.

Figure 2:
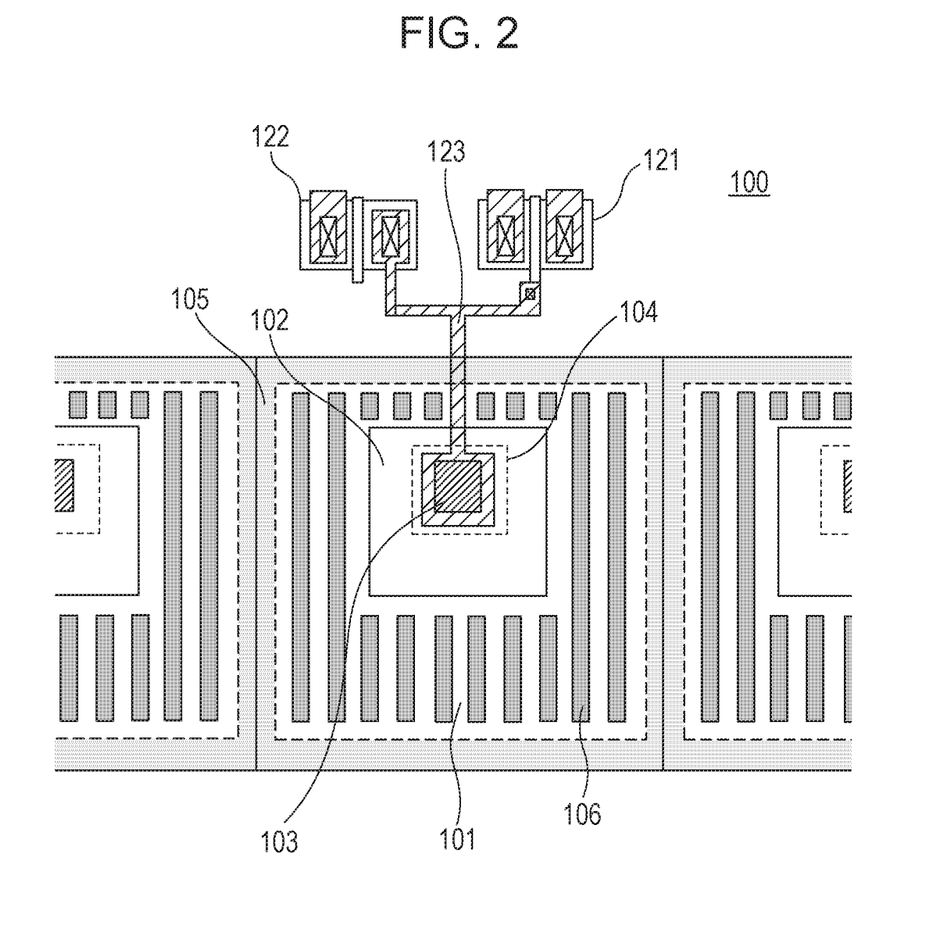
FIG. 2 is a sectional view of an example of part of the photoelectric conversion apparatus according to the first embodiment.

For example, as illustrated in FIG. 2, the reading circuit includes an amplifying transistor 121 and a reset transistor 122. The amplifying transistor 121 and the reset transistor 122 are connected to the third semiconductor region 103 with a conductive wiring 123 interposed therebetween. For example, MOS transistors may be used as the amplifying transistor 121 and the reset transistor 122.

As illustrated in FIG. 2, the photoelectric conversion apparatus 100 includes the photoelectric conversion elements D1. The photoelectric conversion elements D1 are arranged, disposed, or positioned so as to be adjacent to each other, with the corresponding element isolation portions 105 interposed therebetween. One of the photoelectric conversion elements D1 and the element isolation portion 105 surrounding the photoelectric conversion element D1 will now be described in detail. The other photoelectric conversion elements D1 and the other element isolation portions 105 have the same structure as described below. Accordingly, in FIG. 2, the reading circuit and the wiring connected to the reading circuit etc., in each of the photoelectric conversion elements D1 on the left and right sides are omitted.

Figure 3:
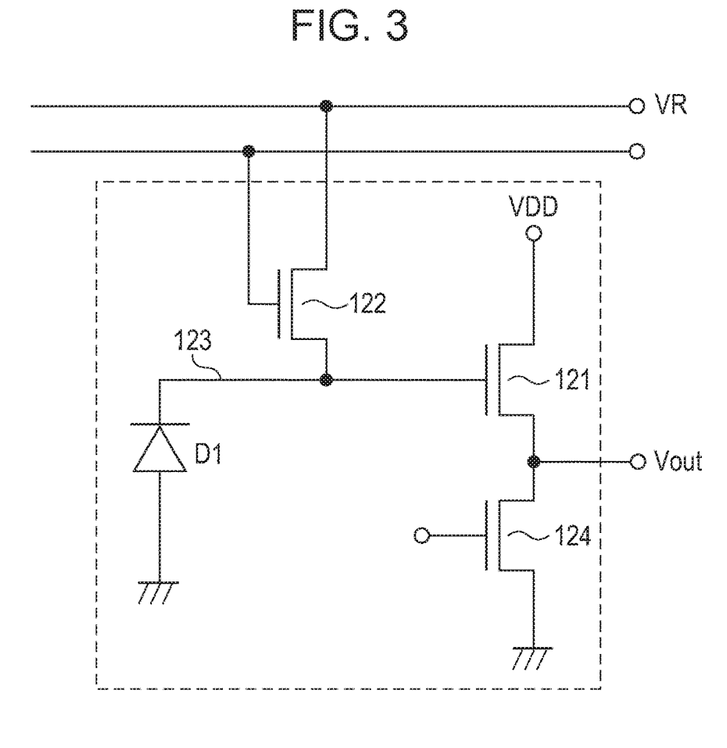
FIG. 3 is a circuit diagram of part of the photoelectric conversion apparatus according to the first embodiment.

FIG. 3 illustrates an example of a circuit diagram of part of the photoelectric conversion apparatus according to the first embodiment. A gate of the amplifying transistor 121 and a terminal of the reset transistor 122 are connected to the third semiconductor region 103 in the photoelectric conversion element D1 with a conductor interposed therebetween. The other terminal of the reset transistor 122 is connected to a wiring VR for applying a reference voltage for a reset. A wiring VDD for applying a power supply voltage is connected to a terminal of the amplifying transistor 121. The other terminal of the amplifying transistor 121 is connected to a terminal of a load 124 formed of a MOS transistor and a signal output line Vout. The other terminal of the load 124 is grounded. The load 124 can be used as a selection transistor.

As illustrated in FIG. 1B, the photoelectric conversion apparatus 100 includes the fourth semiconductor region 104. The fourth semiconductor region 104 has an impurity concentration higher than the impurity concentration of the first semiconductor region 101 and is a P-type impurity region. The fourth semiconductor region 104 includes the recessed portions 106. The fourth semiconductor region 104 has an impurity concentration that prevents the semiconductor region of the semiconductor substrate 400 from being depleted at the interfaces between the semiconductor region and the insulators. This suppresses the occurrence of a dark current on the semiconductor region side at the interfaces.

The fourth semiconductor region extends along the main surface of the semiconductor substrate 400 toward the third semiconductor region beyond the recessed portions 106 closest to the third semiconductor region 103. Accordingly, part of the second semiconductor region 102 is interposed between the first semiconductor region 101 and the fourth semiconductor region 104 in the depth direction (direction perpendicular (which includes substantially perpendicular) to the main surface, on which the recessed portions 106 are formed) of the semiconductor substrate 400.

The element isolation portion 105 is a semiconductor region and can be formed of, for example, a P-type semiconductor region. The impurity concentration of the semiconductor region of the element isolation portion 105 is higher than the impurity concentration of the fourth semiconductor region 104. The element isolation portion 105 functions as a barrier layer that isolates the adjoining photoelectric conversion elements from each other and prevents the signal charges from flowing therefrom.

It is not necessary for the element isolation portion 105 to surround the photoelectric conversion element D1 completely with respect to a plan view of the main surface of the semiconductor substrate 400. That is, the recessed portions 106 and the fourth semiconductor region 104 may be surrounded by the element isolation portion 105. In the case where the element isolation portion 105 surrounds the photoelectric conversion element D1 completely, a leak of charges produced in the photoelectric conversion element D1 can be effectively suppressed.

The second semiconductor region 102 is depleted when a reset voltage is applied via the third semiconductor region 103 and collects the charges while suppressing an increase in volume. When a reset voltage is applied to the third semiconductor region 103, the first semiconductor region 101 is not completely depleted but contains a neutral region (non-depleted region).

As illustrated in FIG. 1A and FIG. 1B, the second semiconductor region 102 and the first semiconductor region 101 form the PN junction in the section perpendicular (which includes substantially perpendicular) to the main surface of the semiconductor substrate 400, on which the recessed portions 106 are formed. Accordingly, charges produced in the first semiconductor region 101 separated from the second semiconductor region 102 in the section move through the first semiconductor region 101 toward the second semiconductor region 102 and are subsequently collected at the third semiconductor region 103. The element isolation portion 105 suppresses the flow of the charges produced in the first semiconductor region 101 into an adjacent pixel, and the charges move toward the second semiconductor region 102 while diffusing.

The charges diffusing through the first semiconductor region 101 reach the vicinity of the PN junction formed of the first semiconductor region 101 and the second semiconductor region 102 and move toward the third semiconductor region 103 as a result of the drift phenomenon due to the electric field of the PN junction. The above effect is achieved in the case where the second semiconductor region 102 and the first semiconductor region 101 are in contact with each other. In addition to this, in the case where the second semiconductor region 102 is surrounded by the first semiconductor region 101, a larger number of the charges can be collected at the second semiconductor region 102 by using the drift phenomenon than in the case where the first semiconductor region 101 and the second semiconductor region 102 are in contact with each other in one direction.

In the case where the impurity concentration of the second semiconductor region 102 is higher than the impurity concentration of the first semiconductor region 101, a depleted region spreads from the second semiconductor region 102 toward the first semiconductor region 101, and accordingly, the charge collection efficiency can be improved. For this reason, the impurity concentration of the second semiconductor region 102 is preferably higher than the impurity concentration of the first semiconductor region 101. Since the charge collection efficiency is improved, the sensor sensitivity of the photoelectric conversion apparatus is improved.

In the case where the impurity concentration of the fourth semiconductor region 104 is lower than the impurity concentration of the second semiconductor region 102, when a depleted region spreads toward the fourth semiconductor region 104, the effect of suppressing the occurrence of a dark current reduces. Accordingly, the impurity concentration of the fourth semiconductor region 104 is preferably higher than the impurity concentration of the second semiconductor region 102.

The thickness and impurity concentration of the first semiconductor region 101, the second semiconductor region 102, the third semiconductor region 103, and the element isolation portion 105 in the direction perpendicular (which includes substantially perpendicular) to the main surface of the semiconductor substrate 400, on which the recessed portions 106 are formed, can be selected from, for example, the range described below. A junction depth from part of the surface of the photoelectric conversion element D1 at which the recessed portions 106 are not formed is used as a parameter of the thickness.

The impurity concentration of the first semiconductor region 101 may be no less than $1.0 \times 10^{14}$ cm$^{-3}$ and no more than $1.0 \times 10^{17}$ cm$^{-3}$, more preferably, no less than $1.0 \times 10^{15}$ cm$^{-3}$ and no more than $1.0 \times 10^{16}$ cm$^{-3}$. The junction depth of the first semiconductor region 101 may be no less than 0.1 μm and no more than 1000 μm. The impurity concentration of the second semiconductor region 102 may be no less than $1.0 \times 10^{13}$ cm$^{-3}$ and no more than $1.0 \times 10^{17}$ cm$^{-3}$, more preferably, no less than $1.0 \times 10^{14}$ cm$^{-3}$ and no more than $1.0 \times 10^{16}$ cm$^{-3}$. The junction depth of the second semiconductor region 102 may be no less than 0.2 μm and no more than 3 μm. The impurity concentration of the third semiconductor region 103 may be no less than $1.0 \times 10^{18}$ cm$^{-3}$ and no more than $1.0 \times 10^{21}$ cm$^{-3}$, more preferably, no less than $1.0 \times 10^{19}$ cm$^{-3}$ and no more than $1.0 \times 10^{20}$ cm$^{-3}$. The junction depth of the third semiconductor region 103 may be no less than 0.1 μm and no more than 0.3 μm.

The impurity concentration of the fourth semiconductor region 104 may be no less than $10^{15}$ cm$^{-3}$ and no more than $10^{19}$ cm$^{-3}$, more preferably, no less than $10^{16}$ cm$^{-3}$ and no more than $10^{18}$ cm$^{-3}$. The junction depth of the fourth semiconductor region 104 may be no less than 0.1 μm and no more than 0.5 μm. The impurity concentration of the semiconductor region of the element isolation portion may be no less than $10^{14}$ cm$^{-3}$ and no more than $10^{19}$ cm$^{-3}$, more preferably, no less than $10^{15}$ cm$^{-3}$ and no more than $10^{18}$ cm$^{-3}$. The junction depth of the semiconductor region of the element isolation portion may be no less than 0.1 μm and no more than 10 μm.

The recessed portions 106 are formed on the main surface (here, the light-receiving surface) of the photoelectric conversion element D1 in the semiconductor substrate 400. The recessed portions 106 may be formed in a manner in which a semiconductor substrate is etched or a semiconductor substrate is subjected to thermal oxidation by using a LOCOS (LOCal Oxidation of Silicon) method. In a LOCOS method or an STI (Shallow Trench Isolation) method, for example, an interlayer insulating layer is formed on the semiconductor substrate 400, and insulators such as silicon oxides are formed on the recessed portions 106.

The first embodiment demonstrates an example in which the photoelectric conversion apparatus 100 includes the LOCOS regions formed by using a LOCOS method as the insulators 201. The recessed portions 106 are not formed on the second semiconductor region 102 but are formed on only the fourth semiconductor region 104. That is, the recessed portions 106 are formed inside the fourth semiconductor region with respect to a plan view of the main surface of the semiconductor substrate 400. Accordingly, the second semiconductor region 102 is neither in contact with nor close to the insulators 201 formed on the recessed portions 106, and accordingly, the occurrence of a dark current can be suppressed.

The fourth semiconductor region 104 is formed on the surface side of the second semiconductor region 102 such that at least a part of the second semiconductor region 102 is interposed between the first semiconductor region 101 and the fourth semiconductor region 104. This effectively reduces the occurrence of a dark current due to an interface defect of the insulators disposed on the recessed portions 106.

The effect of the recessed portions 106 on reducing ripples will now be described with reference to FIG. 4.

Figure 4:
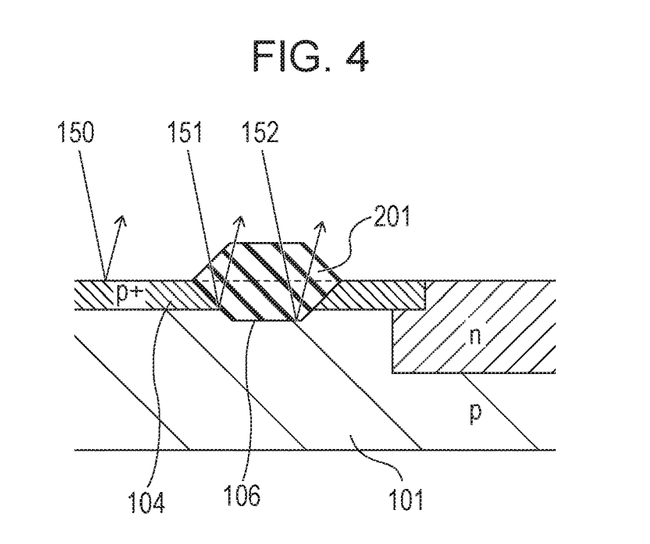
FIG. 4 is a sectional view of part of the photoelectric conversion apparatus according to the first embodiment.

FIG. 4 is a schematic sectional view of part of the photoelectric conversion apparatus illustrating a cut portion at which one of the insulators 201 is formed on the corresponding recessed portion 106. Light incident on the main surface of the photoelectric conversion element D1 is denoted by arrows 150, 151, and 152. The incident light includes the incident light 150 reflected from a region in which the recessed portion 106 is not formed, the incident light 151 reflected from a side wall of the recessed portion 106, and the incident light 152 reflected from the bottom surface of the recessed portion 106.

The recessed portions 106 alter the length of the optical path length of the incident light up to the semiconductor regions 101, 102, 103, and 104 and cause a phase difference of the light reflected at the interfaces between the semiconductor regions 101, 102, 103, and 104 and the insulators 201. Accordingly, even when the output characteristics of the photoelectric conversion apparatus 100 are uneven and rippled, the unevenness can be alleviated by using interference between the incident light and the reflected light. That is, the effect of the interference enables the output ripples of the photoelectric conversion apparatus 100 to be reduced.

According to the first embodiment, the second semiconductor region 102 having the same conductivity type as the signal charges is thus provided, and the second semiconductor region 102 is not close to the insulators 201 disposed on the recessed portions 106. This enables the occurrence of a dark current to be suppressed while improving the charge collection efficiency and reducing the ripples. Accordingly, a photoelectric conversion apparatus having a high S/N ratio can be provided. The structure according to the first embodiment suppresses an increase in dark current, improves the charge collection efficiency, and reduces the output ripples.

Figure 5:
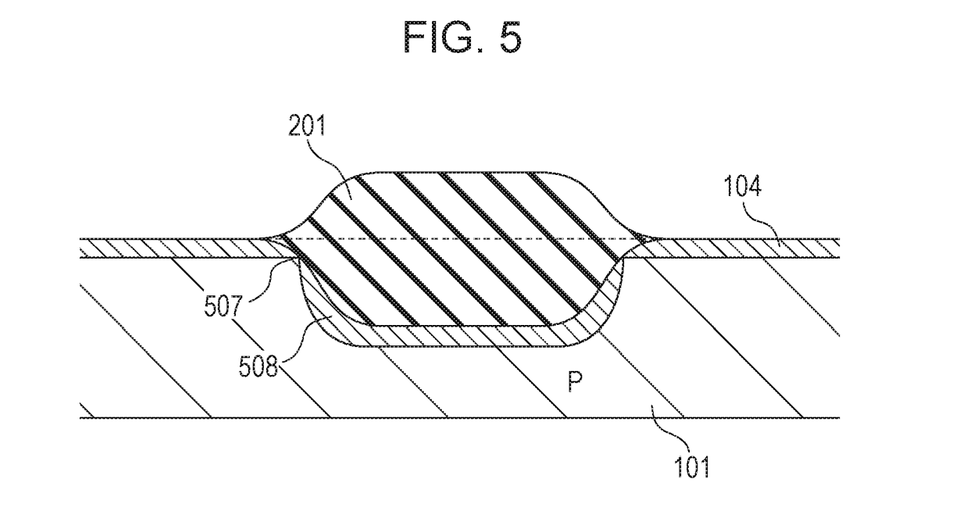
FIG. 5 is a sectional view of the vicinity of a recessed portion of the photoelectric conversion apparatus according to the first embodiment.

The recessed portions 106 and the insulators 201 can be formed by using, for example, a LOCOS method or an STI method. In the case of using a LOCOS method, as illustrated in FIG. 5, the recessed portions 106 can be formed so as to have a gentle slope called a bird's beak, and the area of a surface from which light having an opposite phase reflects can be increased. Accordingly, a countermeasure for the ripples can be effectively performed. However, there is a possibility that a dark current occurs as a result of the effect of a defect at the bird's beak caused by a LOCOS method.

The effect of the defect caused by a LOCOS method can be reduced in a manner in which a P-type semiconductor region 508, which is a channel stop, is formed below each LOCOS region. In this case, however, a region 507 having a low impurity concentration is created near the bird's beak. In the region 507, the potential of the signal charges is low, and a time constant when the collected charges are discharged is large, resulting in an afterimage phenomenon. In the photoelectric conversion apparatus 100 according to the first embodiment, the recessed portions 106 are not formed on the second semiconductor region 102 but are formed on only the fourth semiconductor region 104 or on both of the fourth semiconductor region and the first semiconductor region 101. This enables the occurrence of an afterimage phenomenon to be suppressed, because the recessed portions 106 and the second semiconductor region 102 are not close to each other.

In the case where the recessed portions 106 and the insulators 201 are formed by a LOCOS method, costs can be lower than in the case of using an STI method. The use of the photoelectric conversion apparatus according to the first embodiment enables an imaging apparatus that has high sensitivity and a weak dark current and that suppresses an afterimage to be provided at low costs.

Figure 6:
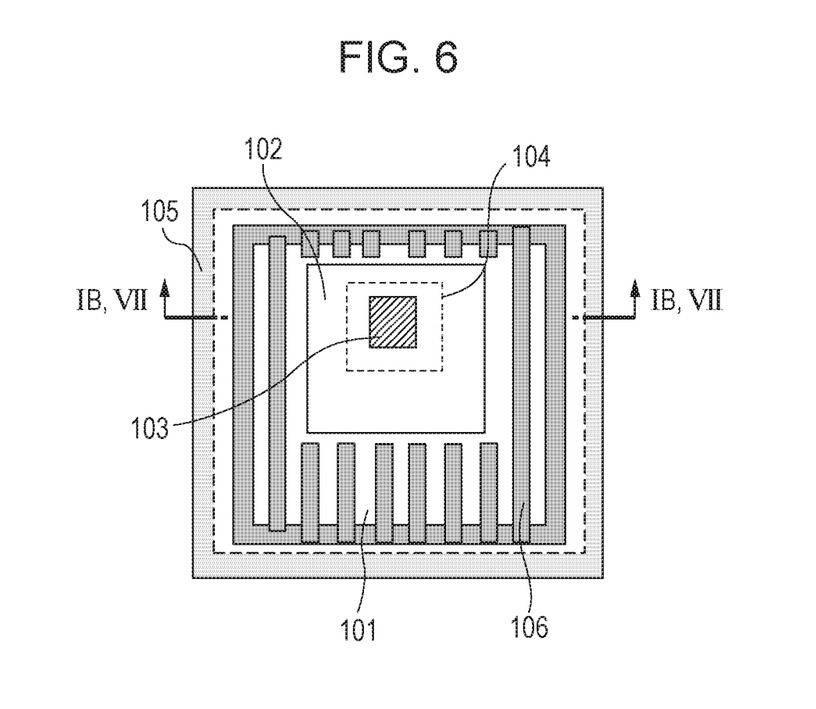
FIG. 6 is a plan view of an example of part of the photoelectric conversion apparatus according to the first embodiment.

According to the first embodiment, the recessed portions are each formed in a stripe shape and are independent of each other. However, the recessed portions may be connected partially to each other and formed integrally with each other. For example, as illustrated in FIG. 6, the recessed portions 106 may be formed integrally with each other such that portions extending along the element isolation portion 105 are connected to each other.

Second Embodiment

FIG. 7 is a sectional view of an example of part of a photoelectric conversion apparatus according to a second embodiment. A schematic plan view thereof is the same as FIG. 1A. Components having functions and structures like those in the first embodiment are designated by like symbols, and a detailed description thereof is omitted.

The photoelectric conversion apparatus according to the second embodiment differs from the photoelectric conversion apparatus according to the first embodiment in that the location of the lower end of the fourth semiconductor region 104 is shallower than the location of the lower end of each insulator 201, which is a LOCOS region. That is, when part of the surface of the semiconductor substrate 400 at which no recessed portions 106 are formed is regarded as a reference surface, the length of the fourth semiconductor region 104 from the reference surface in the vertical direction with respect to the reference surface is shorter than the length from the reference surface to the bottom surface of each recessed portion 106. The insulators 201 disposed on the recessed portions 106 extend through the fourth semiconductor region 104.

In this case, the second semiconductor region 102 is formed so as not to overlap the recessed portions 106 with respect to a plan view of the main surface of the semiconductor substrate 400, on which the recessed portions 106 are formed. For example, the second semiconductor region 102 is interposed between the first recessed portion 106-1 and the second recessed portion 106-2, which are adjacent to each other in the first section perpendicular (which includes substantially perpendicular) to the main surface, with the third semiconductor region 103 interposed therebetween. Accordingly, the second semiconductor region is neither in contact with nor close to the insulators 201 disposed on the recessed portions 106. The first semiconductor region 101 and the second semiconductor region 102 are in contact with each other in the first section, and the PN junction is interposed between the first recessed portion 106-1 and the second recessed portion 106-2.

Accordingly, the second semiconductor region 102 and the third semiconductor region 103 are surrounded by the first semiconductor region 101 with respect to a plan view of the main surface of the semiconductor substrate 400, on which the recessed portions 106 are formed. The recessed portions 106 are formed on only a region in which the recessed portions 106 overlap the first semiconductor region 101 of the semiconductor substrate 400 with respect to this plan view.

With the above structure of the photoelectric conversion apparatus 100, the insulators 201 on the recessed portions 106 extend through the fourth semiconductor region 104 and are in contact with the first semiconductor region 101 or reach the inside of the first semiconductor region 101, but are not in contact with the second semiconductor region 102. Thus, the insulators 201 on the recessed portions are neither in contact with nor close to the second semiconductor region 102, and the occurrence of a dark current can be suppressed.

According to the second embodiment, the thickness of the fourth semiconductor region 104 in the direction perpendicular (which includes substantially perpendicular) to the main surface of the semiconductor substrate 400, on which the recessed portions 106 are formed, is less than that in the photoelectric conversion apparatus according to the first embodiment. This reduces the charges that are produced by photoelectric conversion of light incident on the fourth semiconductor region and that are recombined in the fourth semiconductor region and improves the efficiency of collecting, at the second semiconductor region 102, the signal charges produced by photoelectric conversion. Accordingly, a photoelectric conversion apparatus having a higher S/N ratio can be provided.

Third Embodiment

Figure 8A:
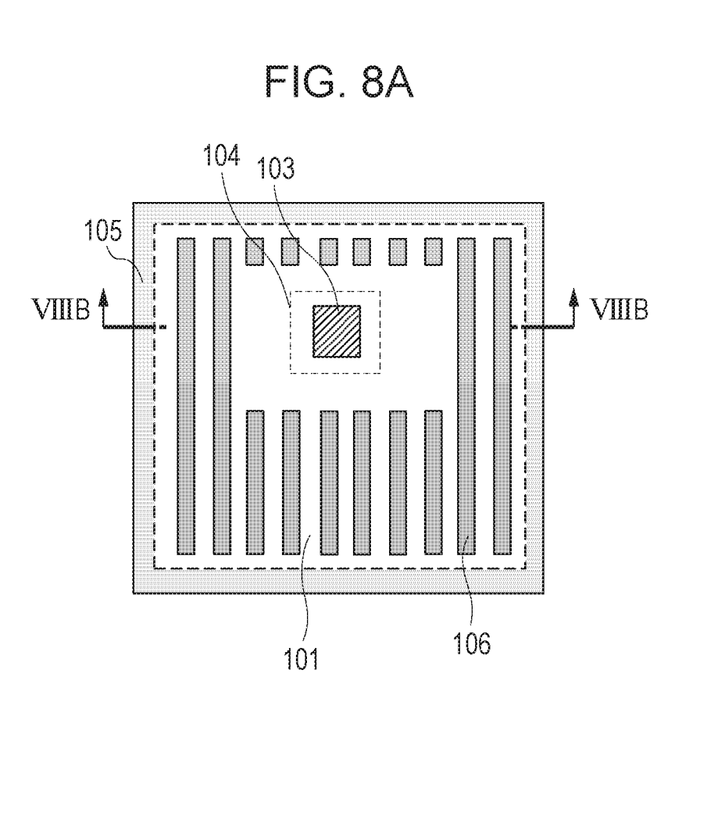
FIG. 8A is a plan view of an example of a photoelectric conversion apparatus according to a third embodiment.
Figure 8B:
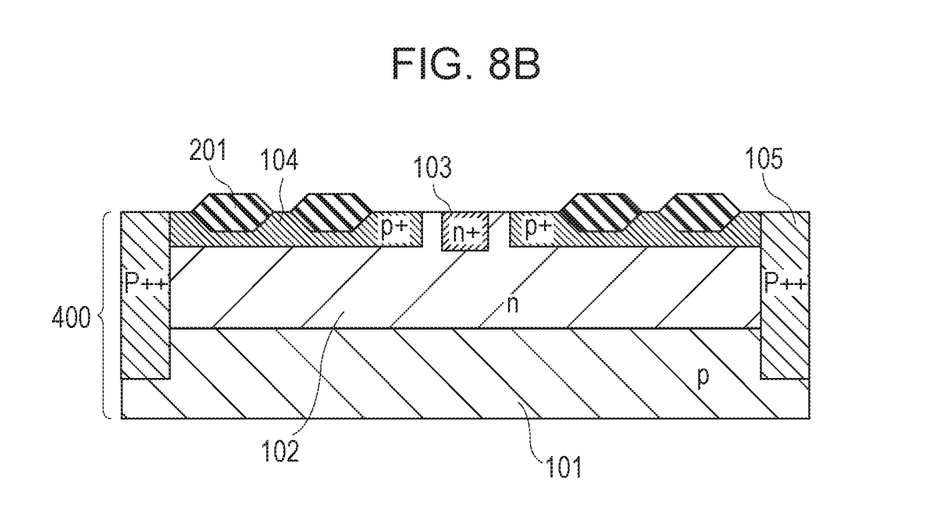
FIG. 8B is a sectional view of the example of the photoelectric conversion apparatus according to the third embodiment.

An example of part of a photoelectric conversion apparatus according to a third embodiment will be described with reference to FIG. 8A and FIG. 8B. FIG. 8A is a plan view of an example of part the photoelectric conversion apparatus according to the third embodiment. FIG. 8B is a sectional view of the example of part of the photoelectric conversion apparatus taken along dashed line VIIIB-VIIIB in FIG. 8A. Components having functions like those in the first embodiment are designated by like symbols, and a detailed description thereof is omitted.

According to the first embodiment, the second semiconductor region 102 is surrounded by the first semiconductor region 101 with respect to a plan view of the main surface of the semiconductor substrate 400, on which the recessed portions 106 are formed. In the photoelectric conversion apparatus 100 according to the third embodiment, the second semiconductor region 102 may extend so as to be in contact with the third semiconductor region 103 and so as to overlap the recessed portions 106 in the direction perpendicular (which includes substantially perpendicular) to the main surface of the semiconductor substrate 400, on which the recessed portions 106 are formed. In the photoelectric conversion apparatus in FIG. 8A and FIG. 8B, the second semiconductor region 102 extends to the element isolation portion 105 so as to overlap the recessed portions 106 in the direction perpendicular (which includes substantially perpendicular) to the main surface of the semiconductor substrate 400, on which the recessed portions 106 are formed.

The formation of the second semiconductor region 102 enables the PN junction formed of the first semiconductor region 101 and the second semiconductor region 102 to collect the charges by using the drift phenomenon and hence enables the efficiency of collecting the charges to be improved as in the other embodiments.

According to the third embodiment, the recessed portions 106 do not extend through the fourth semiconductor region 104 but are formed on the fourth semiconductor region 104. Accordingly, there is the fourth semiconductor region between the insulators 201 on the recessed portions 106 and the second semiconductor region even when the second semiconductor region extends to the element isolation portion 105. Accordingly, the insulators 201 on the recessed portions 106 and the second semiconductor region are neither in contact with nor close to each other, and the occurrence of a dark current can be suppressed.

When part of the surface of the semiconductor substrate 400 at which no recessed portions 106 are formed is regarded as a reference surface, the thickness of the fourth semiconductor region 104 from the reference surface is larger than that in the case of the second embodiment. Accordingly, there is a possibility that the efficiency of collecting the charges produced by photoelectric conversion of light having a short wavelength is lower than that in the photoelectric conversion apparatus 100 according to the second embodiment. However, the third embodiment can be preferably applied to a sensor for light having a long wavelength, particularly near infrared light.

Fourth Embodiment

Figure 9:
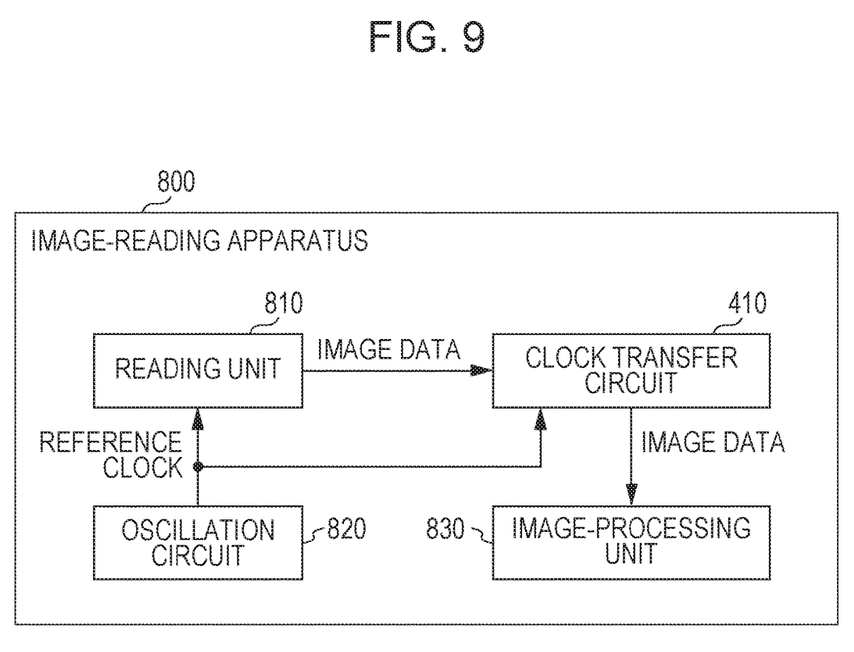
FIG. 9 illustrates an image-reading apparatus according to a fourth embodiment.

An example of the structure of an image-reading apparatus 800 according to a fourth embodiment will be described with reference to a block diagram in FIG. 9. The image-reading apparatus 800 may be, for example, a MFP (multi-function peripheral), a scanner, or a copier. The image-reading apparatus 800 may include a clock transfer circuit 410, a reading unit 810, an oscillation circuit 820, and an image-processing unit 830.

The reading unit 810 reads a manuscript and generates image data. The reading unit 810 may be formed of, for example, a light source, an optical reduction system, a line sensor, an analog-digital convertor, and a controller. The photoelectric conversion apparatus according to any one of the first to third embodiments can be used as the line sensor. The oscillation circuit 820 generates a reference clock and supplies the reference clock to the reading unit 810 and the clock transfer circuit 410. The reading unit 810 operates in accordance with the supplied reference clock. The frequency of the reference clock may be, for example, several hundreds MHz.

The clock transfer circuit 410 receives the image data from the reading unit 810 in accordance with the reference clock and supplies the image data to the image-processing unit 830 in accordance with a spread-spectrum clock. The image-processing unit 830 processes the supplied image data. Thus, the processing unit processes data based on the image data output from the reading unit 810.

The reading unit 810, the oscillation circuit 820, and the clock transfer circuit 410 may be mounted on a movable portion of the image-reading apparatus 800. The image-processing unit 830 may be mounted on the main body of the image-reading apparatus 800. The clock transfer circuit 410 and the image-processing unit 830 may be connected to each other by using, for example, a wire harness of several tens of centimeters.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-103715 filed May 24, 2016, which is hereby incorporated by reference herein in its entirety.

What is claimed is:

1. A photoelectric conversion apparatus, comprising:
    a semiconductor substrate including recessed portions formed on a main surface thereof; and
    insulators disposed on the respective recessed portions,
    wherein the semiconductor substrate includes a photoelectric conversion element having a first-conductivity-type first semiconductor region, a second-conductivity-type second semiconductor region that is of a conductivity type opposite to the first-conductivity-type and that has the same polarity as a signal charge, and a second-conductivity-type third semiconductor region that has an impurity concentration higher than an impurity concentration of the second semiconductor region where at least a part of the second-conductivity-type third semiconductor region is formed closer than a part of the second semiconductor region to the main surface,
    wherein a first recessed portion and a second recessed portion of the recessed portions are arranged so as to be adjacent to each other in a first section perpendicular to the main surface, with the third semiconductor region interposed therebetween,
    wherein the second semiconductor region includes a region interposed between the first recessed portion and the second recessed portion in the first section and is in contact with the first semiconductor region, and
    wherein a PN junction formed of the first semiconductor region and the second semiconductor region is interposed between the first recessed portion and the second recessed portion in the first section.

2. The photoelectric conversion apparatus according to claim 1,
    wherein a third recessed portion and a fourth recessed portion of the recessed portions are arranged so as to be adjacent to each other in a second section intersecting the first section perpendicular to the main surface, with the third semiconductor region interposed therebetween, and
    wherein the second semiconductor region includes a region interposed between the third recessed portion and the fourth recessed portion in the second section, and the PN junction formed of the first semiconductor region and the second semiconductor region is interposed between the third recessed portion and the fourth recessed portion in the second section.

3. The photoelectric conversion apparatus according to claim 1,
    wherein the semiconductor substrate comprises a first-conductivity-type fourth semiconductor region that is formed on a main surface side of the semiconductor substrate and that surrounds the second semiconductor region and the third semiconductor region;
    wherein an impurity concentration of the fourth semiconductor region is higher than an impurity concentration of the first semiconductor region, and
    wherein the recessed portions are formed inside the fourth semiconductor region with respect to a plan view of the main surface.

4. The photoelectric conversion apparatus according to claim 3,
    wherein a depth from the main surface of the semiconductor substrate to a bottom portion of each of the insulators on the recessed portions is larger than a depth of the fourth semiconductor region.

5. The photoelectric conversion apparatus according to claim 3,
    wherein a depth from the main surface of the semiconductor substrate to a bottom portion of each of the insulators on the recessed portions is less than a depth of the fourth semiconductor region.

6. The photoelectric conversion apparatus according to claim 3, further comprising:
    an element isolation portion that surrounds the fourth semiconductor region with respect to the plan view of the main surface,
    wherein the recessed portions are surrounded by the element isolation portion.

7. The photoelectric conversion apparatus according to claim 3,
    wherein part of the second semiconductor region is interposed between the first semiconductor region and the fourth semiconductor region in a direction perpendicular to the main surface.

8. The photoelectric conversion apparatus according to claim 3,
    wherein the impurity concentration of the fourth semiconductor region is higher than the impurity concentration of the second semiconductor region.

9. The photoelectric conversion apparatus according to claim 1,
    wherein the recessed portions overlap the first semiconductor region with respect to a plan view of the main surface.

10. The photoelectric conversion apparatus according to claim 1, further comprising:
    a conductor that is formed through an opening formed in an insulating layer on the semiconductor substrate and that is in contact with the third semiconductor region.

11. The photoelectric conversion apparatus according to claim 1,
    wherein the third semiconductor region is surrounded by the second semiconductor region with respect to a plan view of the main surface.

12. The photoelectric conversion apparatus according to claim 1,
    wherein part of the second semiconductor region is interposed between the first semiconductor region and the third semiconductor region in a direction perpendicular to the main surface.

13. The photoelectric conversion apparatus according to claim 1,
    wherein the insulators are made of a silicon oxide.

14. The photoelectric conversion apparatus according to claim 1,
    wherein the insulators are LOCOS (LOCal Oxidation of Silicon) regions.

15. The photoelectric conversion apparatus according to claim 1,
wherein the insulators are interlayer insulating layers formed on the semiconductor substrate.

16. The photoelectric conversion apparatus according to claim 1,
wherein the impurity concentration of the second semiconductor region is higher than the impurity concentration of the first semiconductor region.

17. An image-reading apparatus, comprising:
the photoelectric conversion apparatus according to claim 1;
a reading unit that reads a manuscript and generates image data; and
a processing unit that processes data based on the image data.

18. A photoelectric conversion apparatus, comprising:
a semiconductor substrate including recessed portions formed on a main surface thereof; and
insulators disposed on the respective recessed portions,
wherein the semiconductor substrate includes a photoelectric conversion element having a first-conductivity-type first semiconductor region, a second-conductivity-type second semiconductor region that is of a conductivity type opposite to the first-conductivity-type and that has the same polarity as a signal charge, and a second-conductivity-type third semiconductor region that has an impurity concentration higher than an impurity concentration of the second semiconductor region where at least a part of the second-conductivity-type third semiconductor region is formed closer than the second semiconductor region to the main surface,
wherein a first-conductivity-type fourth semiconductor region that has an impurity concentration higher than an impurity concentration of the first semiconductor region is formed in a region of the semiconductor substrate at an interface between each of the insulators and the semiconductor substrate,
wherein the recessed portions are formed on the fourth semiconductor region, and
wherein the fourth semiconductor region overlaps at least one of the first semiconductor region and the second semiconductor region with respect to a plan view of the main surface.

19. The photoelectric conversion apparatus according to claim 18,
wherein the second semiconductor region overlaps the recessed portions with respect to the plan view of the main surface.

20. The photoelectric conversion apparatus according to claim 18, further comprising:
an element isolation portion that surrounds the fourth semiconductor region with respect to the plan view of the main surface,
wherein the second semiconductor region is in contact with the element isolation portion.

21. The photoelectric conversion apparatus according to claim 18, further comprising:
an element isolation portion that surrounds the fourth semiconductor region with respect to the plan view of the main surface,
wherein the recessed portions are surrounded by the element isolation portion.

22. The photoelectric conversion apparatus according to claim 18,
wherein the recessed portions overlap the first semiconductor region with respect to the plan view of the main surface.

23. The photoelectric conversion apparatus according to claim 18, further comprising:
a conductor that is formed through an opening formed in an insulating layer on the semiconductor substrate and that is in contact with the third semiconductor region.

24. The photoelectric conversion apparatus according to claim 18,
wherein the third semiconductor region is surrounded by the second semiconductor region with respect to the plan view of the main surface.

25. The photoelectric conversion apparatus according to claim 18,
wherein part of the second semiconductor region is interposed between the first semiconductor region and the third semiconductor region in a direction perpendicular to the main surface.

26. The photoelectric conversion apparatus according to claim 18,
wherein part of the second semiconductor region is interposed between the first semiconductor region and the fourth semiconductor region in a direction perpendicular to the main surface.

27. The photoelectric conversion apparatus according to claim 18,
wherein the insulators are made of a silicon oxide.

28. The photoelectric conversion apparatus according to claim 18,
wherein the insulators are LOCOS (LOCal Oxidation of Silicon) regions.

29. The photoelectric conversion apparatus according to claim 18,
wherein the insulators are interlayer insulating layers formed on the semiconductor substrate.

30. The photoelectric conversion apparatus according to claim 18,
wherein the impurity concentration of the second semiconductor region is higher than the impurity concentration of the first semiconductor region.

31. The photoelectric conversion apparatus according to claim 18,
wherein the impurity concentration of the fourth semiconductor region is higher than the impurity concentration of the second semiconductor region.

32. An image-reading apparatus, comprising:
the photoelectric conversion apparatus according to claim 18;
a reading unit that reads a manuscript and generates image data; and
a processing unit that processes data based on the image data.

* * * * *